United States Patent
Chiu et al.

(10) Patent No.: US 6,756,800 B2
(45) Date of Patent: Jun. 29, 2004

(54) SEMICONDUCTOR TEST SYSTEM WITH EASILY CHANGED INTERFACE UNIT

(75) Inventors: Michael A. Chiu, Somerville, MA (US); Neil R. Bentley, Westborough, MA (US); Wayne Petitto, Leominster, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/173,357

(22) Filed: Jun. 17, 2002

(65) Prior Publication Data

US 2003/0194821 A1 Oct. 16, 2003

Related U.S. Application Data

(60) Provisional application No. 60/372,997, filed on Apr. 16, 2002.

(51) Int. Cl.[7] ................................. G01R 31/02

(52) U.S. Cl. .................. 324/754; 324/158.1; 324/765

(58) Field of Search .................. 324/765, 754, 324/758, 158.1, 72.5, 73.1, 761; 439/348

(56) References Cited

U.S. PATENT DOCUMENTS

| | | | | |
|---|---|---|---|---|
| 4,705,447 A | * | 11/1987 | Smith | 414/590 |
| 5,497,103 A | * | 3/1996 | Ebert et al. | 324/754 |
| 5,506,512 A | * | 4/1996 | Tozawa et al. | 324/754 |
| 5,510,724 A | * | 4/1996 | Itoyama et al. | 324/760 |
| 5,530,374 A | * | 6/1996 | Yamaguchi | 324/758 |
| 5,656,942 A | * | 8/1997 | Watts et al. | 324/754 |
| 5,821,764 A | * | 10/1998 | Slocum et al. | 324/758 |
| 5,955,876 A | * | 9/1999 | Yamauchi et al. | 324/158.1 |
| 6,271,658 B1 | * | 8/2001 | Vallinan et al. | 324/158.1 |
| 6,462,532 B1 | * | 10/2002 | Smith | 324/158.1 |
| 6,507,185 B1 | * | 1/2003 | Hennekes et al. | 324/158.1 |
| 6,551,122 B2 | * | 4/2003 | Bosy et al. | 439/348 |

* cited by examiner

*Primary Examiner*—Kamand Cuneo
*Assistant Examiner*—Jimmy Nguyen
(74) *Attorney, Agent, or Firm*—Lance Kreisman

(57) ABSTRACT

A subassembly to aid in changing the interface unit for an automatic test system. The disclosed embodiment shows an automatic test system with a handler and a tester. The interface unit is a device interface board (DIB). The subassembly allows the DIB to be easily accessed, yet can be properly aligned to the test system. No special tools are required to change the DIB.

20 Claims, 5 Drawing Sheets

SEMICONDUCTOR TEST SYSTEM WITH EASILY CHANGED INTERFACE UNIT

RELATED APPLICATION INFORMATION

This application claims priority to U.S. provisional application No. 60/372,997 filed Apr. 16, 2002.

FIELD OF THE INVENTION

This invention relates generally to manufacture of semiconductor devices and more particularly to interface units used to interface a test system to a device under test.

BACKGROUND

In the manufacture of semiconductor devices, the semiconductor devices are usually tested at least once during the manufacturing operation. The results of the testes are used to control further processing in the semiconductor manufacturing operation. The testing might be used to separate properly operating devices from devices that fail to operate properly. However, testing can also be used to feed back data to other stages in the manufacturing operation to make adjustments that increase the yield of properly operating devices. In other instances, the test results are used to sort devices into performance categories. For example, a device might operate at data rates of 200 MHz, but not operate at data rates of 400 MHz. Following testing, the device might be classified as a 200 MHz device and sold at a lower price than a 400 MHz device.

A testing stage might also be used to make physical changes to the device under test. Many semiconductor devices with memories contain redundant elements. If defective memory cells are discovered during testing, the semiconductor device might be sent to a repair station, such as a laser repair station, where connections on the device are rearranged to disconnect the faulty cells and connect redundant elements in their places.

Testing is generally performed by Automatic Test Equipment (ATE). A tester contains the circuitry that generates and measures the electrical signals needed to determine if the device is properly functioning. A separate material handling device moves the semiconductor devices to the tester. A material handling device is often called a "handler" when the semiconductor devices are being tested after they have been packaged. A material handling device might alternatively be called a "prober", which is used when the semiconductor devices are tested while still on a wafer. In general, the tester and the material handling device are assembled into a work cell, with the specific characteristics of the tester and material handling device being selected based on the type of devices that are to be tested.

To allow the tester to make connections to many different types of devices, an interface unit is used. Often, the interface unit has many compliant probes or contacts. The material handling device presses the devices to be tested against these probes or contacts so that electrical signals can move between the device under test and the tester. For testing packaged parts, the interface unit is often called a "device interface board" or "DIB".

The present invention is, in its preferred embodiment, used in connection with a material handling unit for moving packaged parts to a DIB. Therefore, the description of the preferred embodiment that follows uses a packaged part handler with a DIB as an example.

The layout of the contacts on the interface unit must line-up with the test points on the devices being tested, a different interface unit is usually required for each type of semiconductor device being tested. Because a semiconductor manufacturer will generally want to use a work cell to test different kinds of semiconductor devices, the interface unit is made a separate part from the material handling unit or the tester. In this way, the work cell can be reconfigured to test whatever kinds of parts the semiconductor fab is producing.

For example, a DIB is usually attached to a material handling unit with screws that can be removed to remove the DIB. Once the DIB is attached to the material handling unit, the tester, or at least a test head portion of the tester, is then pressed against the material handling unit. Spring pins or other form of compliant contacts make electrical connection between the DIB and the tester.

In manufacturing semiconductors, it is desirable that the equipment in the fabrication facility be in service as much as possible. Taking equipment out of service, even to make routine adjustments to the equipment, can reduce the cost effectiveness of the entire manufacturing operation. For that reason, it is desirable that the process of changing a DIB in a test work cell be done as quickly as possible. Finding special tools to attach or detach a DIB is therefore a disadvantage.

In some prior art ATE, clamps, cams or the like are used to hold the DIB to the handler. In this way, a DIB can be removed and a new one can be installed without the time needed to remove screws. However, significant time is still required to change a DIB.

The DIB is located between the tester and the handler. To access the DIB, the tester must be moved. To allow for access to the DIB, most testers are mounted on devices called a "manipulator." The manipulator allows the tester to be aligned with the handler. Considerable flexibility in positioning the tester is possible with most manipulators. To provide access to the DIB, the manipulator can swing the test head out the way.

But, once a new DIB has been installed, the tester must be re-aligned with the handling device and then reconnected to it. The process of aligning the tester and handler and connecting them together is sometimes called "docking." Un-docking and re-docking the tester and handler during a DIB change can still take a significant amount of time, even when a clamp, cam or similar device holds the DIB to the handler instead of screws.

In addition, a traditional DIB changing operation exposes sensitive and easily damages parts of the tester and the handler. For example, spring pins making electrical connection between the tester and the DIB might be damaged.

Further, special training is sometimes needed to ensure that the operator properly installs the DIB. If not properly installed, damage to the tester, handler or DIB might occur and the semiconductor manufacturing operation might be disrupted.

SUMMARY OF THE INVENTION

With the foregoing background in mind, it is an object of the invention to provide an improved way to change an interface unit in a semiconductor manufacturing facility.

The foregoing and other objects are achieved in which an ATE work cell is equipped with a changer for an interface unit between a tester and a material handling unit. The changer allows the interface unit to be changed with only a small amount of separation between the material handling unit and the tester.

In one aspect, the invention allows an interface unit, such as a DIB, to be easily installed. The changer guides the interface unit into course alignment through translation in a direction parallel to the mating interface between the material handling unit and the tester. Then, the interface unit moves in a direction perpendicular to the mating interface, with fine alignment in a direction within the plane being provided by alignment features that operate as the interface unit moves perpendicular to the mating interface.

In another aspect, the invention allows an interface unit to be easily removed. The interface unit moves perpendicular to the mating interface to disengage from alignment features. Then, the interface unit moves perpendicular to the mating interface to a position where it can be easily removed by a human operator.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
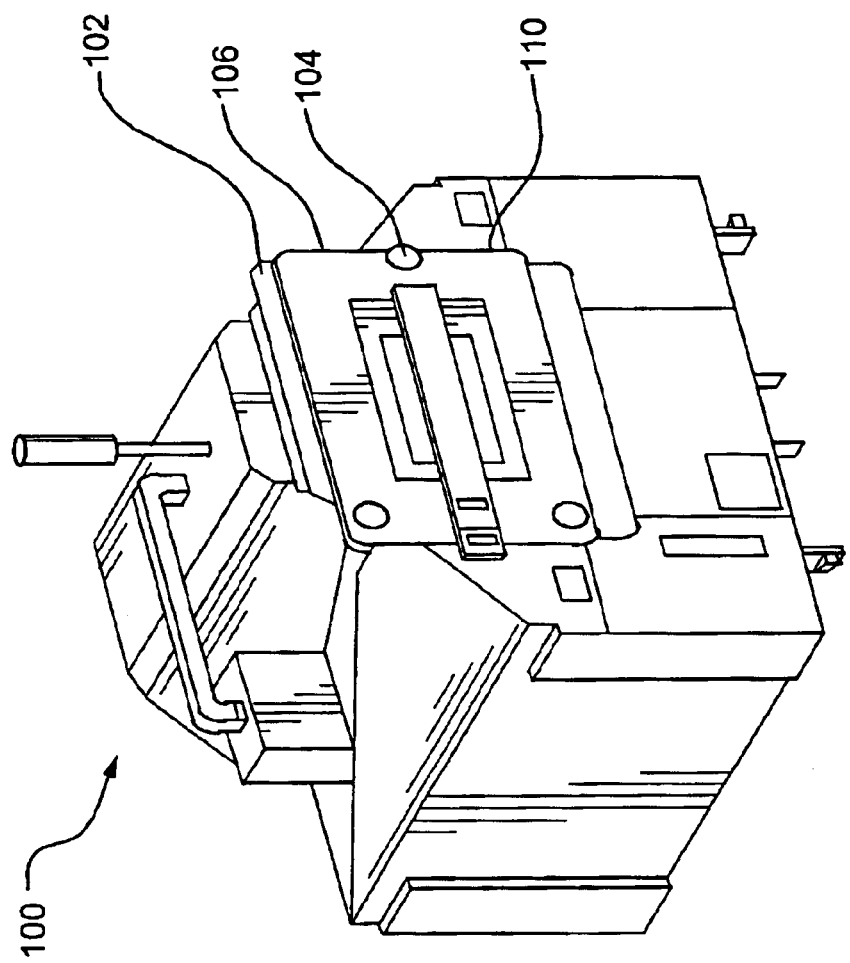
FIG. 1 is a sketch of a handler incorporating a DIB changer according to the invention.

FIG. 1 shows a material handling unit suitable for use in a semiconductor manufacturing operation. Here, a handler 100 is illustrated. Handler 100 moves packaged parts to a test system (310, FIG. 3).

Handler 100 includes an interface area 102, where handler 100 interfaces to a test system. The interface area of a handler typically includes mechanical alignment and support structures so that a tester may be docked to the handler. Here, interface area 102 falls in a vertical plane. Alignment features 104 are shown for aligning handler 100 and the tester.

Preferably, the alignment features create a kinematic coupling as described in U.S. Pat. No. 5,821,764, entitled "Interface Apparatus for Automatic Test Equipment," which is hereby incorporated by reference. The interface apparatus described in this patent aligns the tester and the handler. In addition, that interface apparatus allows a force to be generated to pull the tester towards the handler and hold it in position.

Interface area 102 helps define a mating interface between the tester and the handler. In general, semiconductor devices to be tested will be tested while in a plane that is substantially parallel to this mating interface.

The material handling unit includes an interface unit, which, in the illustrated examples, is device interface board (DIB) 106. DIB 106 includes electrical contactors (510, FIG. 5) for making electrical connections to leads on the semiconductors to be tested. Handler 100 carries parts to DIB 106 and presses the devices into the contactors 510 to make electrical contact to them. DIB 106 also has conductive pads on it which make electrical contact to contacts (416, FIG. 4) on the tester.

During semiconductor manufacture, it is often necessary to either install or remove DIB 106. DIB changer assembly 110 makes such a DIB change operation simple, quick and does not require the use of any special tooling.

FIG. 1 shows the handler 100 without the tester attached. The tester is mounted in such away that the tester and the handler can be separated to allow access to the mating interface. A preferred method of separating the tester and the handler is to attach the tester to a manipulator, allowing the tester to be moved. Advantageously, with the DIB changer described herein, very little movement of the test head is required to change the DIB. And, it is not necessary to swing the tester away from the handling device. On the order of 18 inches (45 cm) of separation perpendicular to the mating interface is required in the preferred embodiment.

The presently preferred manipulator is described in our co-pending U.S. provisional application No. 60/373,065 entitled "Single Axis Manipulator With Controlled Compliance" filed on the same date as the present application, which is hereby incorporated by reference. This manipulator resembles a cart that can be wheeled towards the handler.

Figure 2:
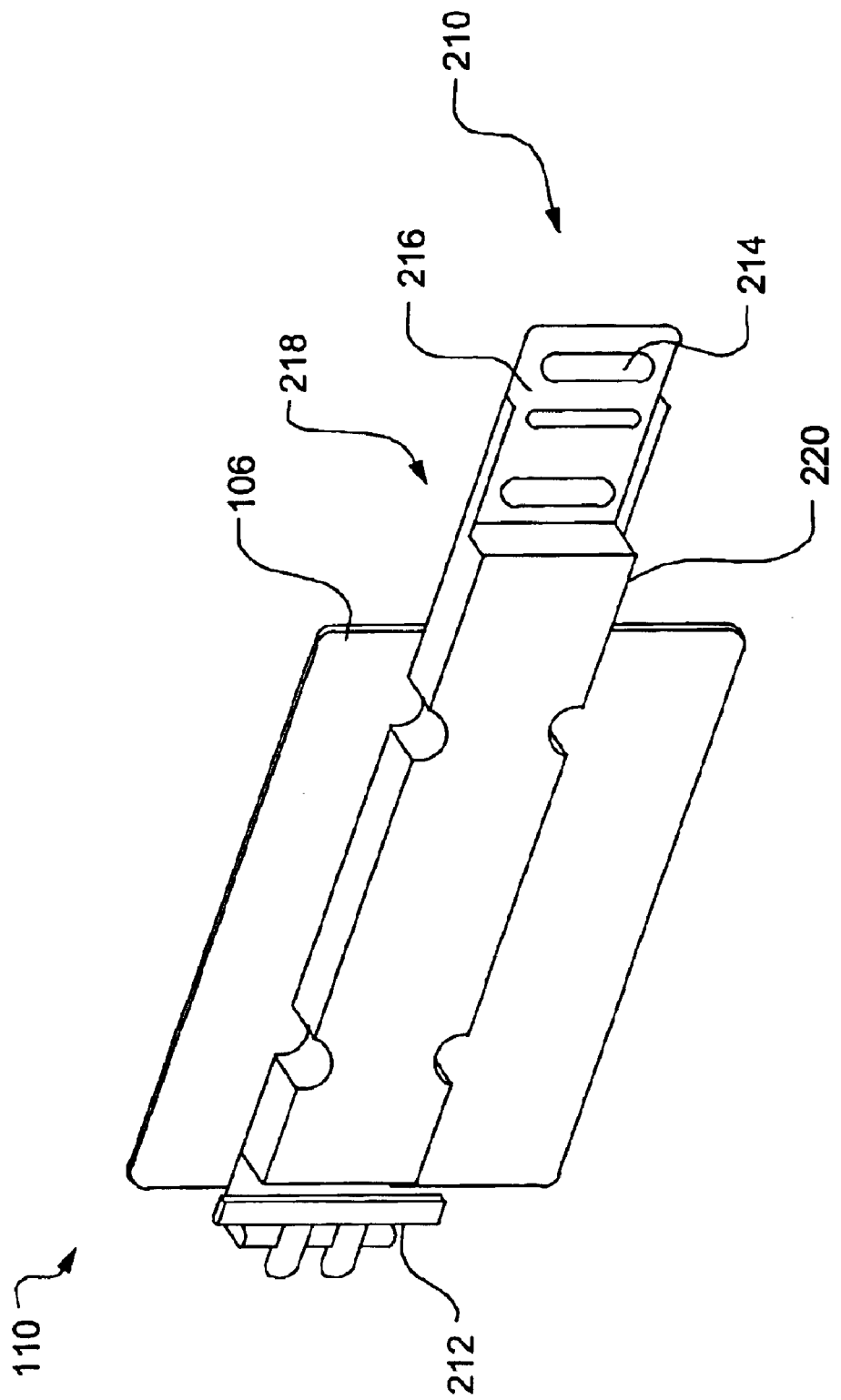
FIG. 2 is sketch of the DIB changer of FIG. 1 in greater detail.

FIG. 2 shows greater detail of DIB changer assembly 110. DIB changer assembly includes a base member, which, in the preferred embodiment, is swing arm 210. Swing arm 210 includes an attachment mechanism to attach DIB changer assembly 110 to handler 100. The attachment mechanism allows swing arm 210 to move DIB 106 away from the interface area 102. In the illustrated embodiment, the attachment mechanism is a hinge 212. Therefore, swing arm 210 can rotate DIB 106 away from interface surface 102.

As will be described in greater detail below, hinge 212 does not provide fine alignment of DIB 106 to handler 100. Therefore, it is not necessary that hinge 212 be precision machined. To the contrary, it is preferable that hinge 212 contain some play or compliance so that it does not constrain the effectiveness of other alignment features.

Swing arm 210 also includes a handle 214 that can be grasped by a human operator wishing to make a DIB change. Swing arm 210 is preferable long enough that when hinge 212 is attached to handler 100, handle 214 is accessible to a human operator during the DIB change operation.

It is desirable that swing arm 210 be secured to handler 100 when a DIB change operation is not being conducted. In the preferred embodiment, handle 214 also acts as a latch, engaging a complementary component (410, FIG. 4) attached to handler 100.

DIB 106 is mounted to swing arm 210. The mounting allows DIB 106 to move relative to swing arm 210 and to be removed entirely. In the preferred embodiment, swing arm 210 includes linear rails 216. Rails 216 allow DIB 106 to slide along the length of swing arm 210.

In the illustrated embodiments, DIB 106 is not mounted directly to rails 216. Rather, DIB 106 is mounted to swing arm 210 through one or more other stages. The stages provide mechanical support to DIB 106 and reduce the amount of force placed on the DIB during a DIB change operation. Because DIBs are often both fragile and expensive, it will usually be preferable to use such intermediate stages to avoid damage to the DIB.

In FIG. 2, DIB 106 is shown mounted to a DIB stage 218. In the illustrated embodiment, DIB stage 218 is mounted to an intermediate stage (340, FIG. 3). Intermediate stage 340 is in turn mounted to the rails 216. Where an intermediate stage is used, DIB stage 218 will preferably be mounted to the intermediate stage in a way that also allows motion. In the preferred embodiment, DIB stage 218 is mounted to intermediate stage 340 through linear rails parallel to rails 216.

In this way, DIB stage 218, intermediate stage 340 and swing arm 210 create a telescoping assembly. The number of intermediate stages increases the travel of the telescoping assembly without necessarily increasing the length of the assembly when collapsed. The greater the telescoping, the greater the distance DIB 106 can be removed from interface area 102. The amount of motion required in any particular embodiment will depend on the size of tester because it will be preferred that DIB 106 be moved far enough to be readily accessible to a human operator when the telescoping assembly is fully extended.

The telescoping assembly preferably includes a handle that allows a human operator to move the DIB 106 towards or away from the mating area. In FIG. 2, this handle is shown as handle 220 on DIB stage 218.

Figure 3:
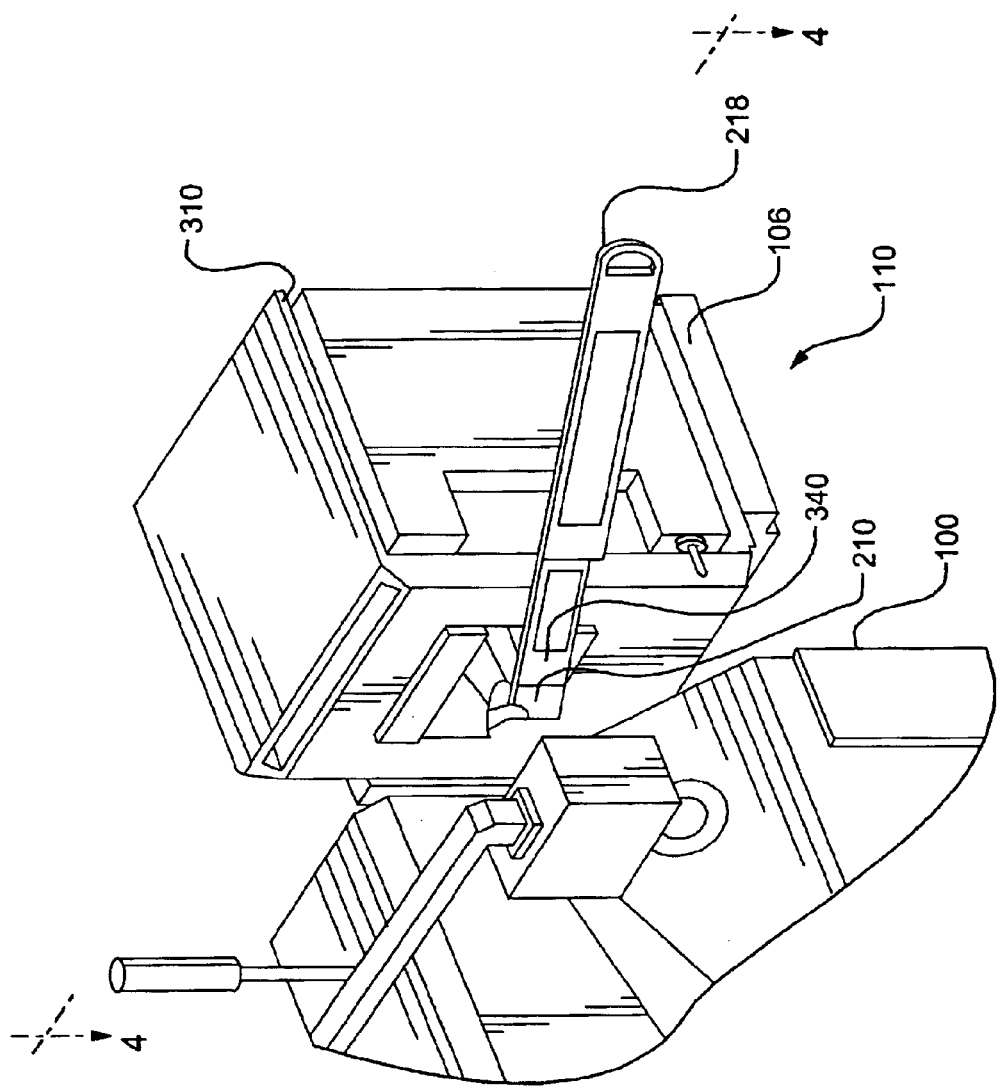
FIG. 3 is a sketch showing a work cell with a DIB changer at one stage of use.

FIG. 3 shows the DIB changer assembly 110 with the telescoping assembly extended. In this view, tester 310 is shown separated from handler 100 a sufficient distance to allow operation of DIB changer 110.

Swing arm 210 is swung away from the mating interface. Intermediate stage 340 is extended and DIB stage 218 is also extended. As can be seen in FIG. 3, DIB assembly 218 clears the side of tester 310, allowing easy access to DIB 106. Preferably, DIB stage 218 can be completely detached from intermediate stage 340 so that a different DIB stage 218, with a different DIB 106 can be installed in its place.

Figure 4:
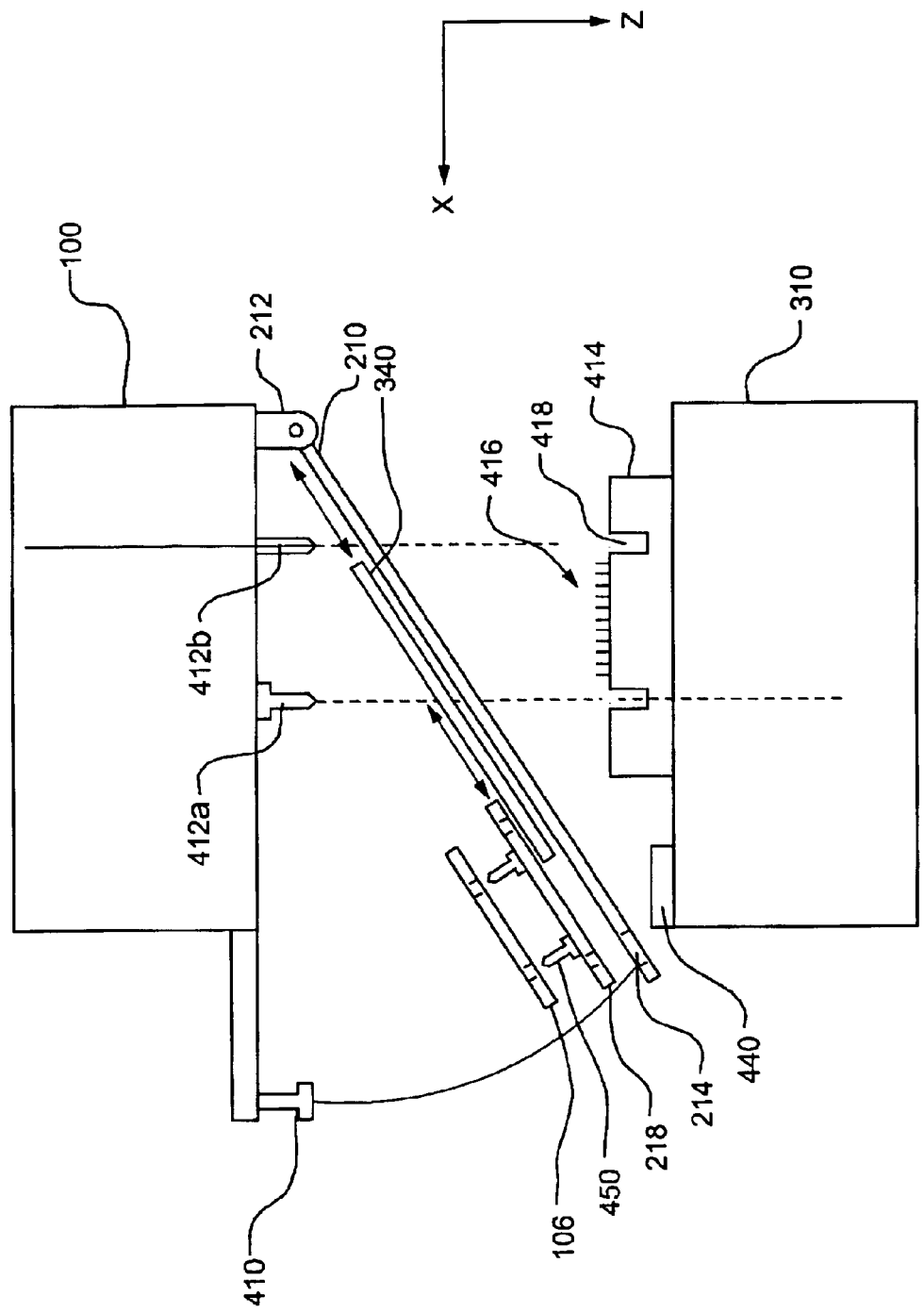
FIG. 4 is a cross sectional view of a work cell from the perspective of line 4—4 in FIG. 3.

FIG. 4 shows a side view of the test cell taken from the perspective of the line 4—4 in FIG. 3. As seen, swing arm 210 is mounted to handler 100 through hinge 212 and picots around hinge 212. As swing arm rotates, it moves DIB 106 in a direction Z away from the mating interface.

As intermediate stage 340 and DIB stage 218 slide along the axis defined by swing arm 210, DIB 106 moves in a direction X, that is parallel to the mating interface. It should be noted that swing arm 210 does not need to be aligned with the X direction to provide move DIB 106 further from the interface area in the X direction.

Certain features of the operation of DIB changer 110 can be seen in FIG. 4. FIG. 4 shows that DIB stage 218 contains alignment pins 450 that are used to align DIB 106 to DIB stage 218.

Alignment pins 412A and 412B are also used to align DIB stage 218 to handler 100. As mentioned above, most of the components of DIB changer 110 are not precision components. It is actually preferable that there be some compliance in most of the components so that alignment pins 412A and 412B control the final position of DIB 106, ensuring that it is properly aligned with handler 100. Pins 412A and 412B pass through holes (512, FIG. 5) in DIB stage 218. DIB stage can, because it is mounted on linear rails can move along the X-axis. Compliance in the other components, such as hinge 212 or linear rails 216 allows sufficient adjustment to allow a final, precise position of the DIB 106 relative to handler 100.

In FIG. 4, the pins 412A and 412B are shown to have a "stepped" configuration. The tips are narrower than the bases. The bases are made with precision. The tips require less precision in manufacture because the bases actually set the final position of DIB 106. The tips of alignment pins 412A and 412B also must be smaller than the bases so as not to interfere with the sides of holes 512 as swing arm 210 pivots around hinge 212. As stated above, pivoting swing arm 210 moves DIB 106 in the direction indicated Z. However, there are other components to the motion.

Preferably, the edges of alignment pins and sides of holes 512 will actually be shaped, very near the final alignment points, to accommodate all components of the swing motion without binding. In a preferred embodiment, the bases of the alignment pins and sides of holes 512 are parallel to each other and are tangent to the arc that is traced out by the holes 512 as swing arm 210 pivots. By making the tips of pins 412A and 412B much narrower than holes 512, there is no need for any special shape to avoid binding between the pins and the sides of holes 512.

Alignment pins 412A and 412B also serve to provide alignment to the tester in the illustrated embodiment. Tester 310 includes an interface area 414 that includes spring pins 416. Spring pins 416 make electrical contact to DIB 106. Interface area 414 includes alignment features 418 that receive alignment pins 412A and 412B. Alignment pins 412A and 412B can force alignment of the interface area 414 to the same features to which DIB 106 is aligned. In this way, once the tester and the handler are tightly docked, the necessary components of the handler, DIB and tester are properly aligned.

FIG. 4 also shows that handler 100 may be equipped with a latch 410 to prevent unintended motion of the DIB changer assembly. Latch 410 may be any known latching mechanism. For example, a spring loaded latch assembly might be used.

In a preferred embodiment, handle 214 acts as a mating portion of the latch. Latch 410 engages handle 214 to hold swing arm 210 in a closed position. However, latch 410 can be open, to allow swing arm 210 to move.

A latch 440 can also be included on tester 310. Latch 440 engages with a complementary feature on swing arm 210 when the swing arm 210 is opened. Latch 440 provides greater stability for changing a DIB, but is not essential to the invention.

FIG. 4 shows that, when opened, spring pins 416 are shielded from a human operator changing the DIB by DIB changer assembly 110. In this way, the chance of damage to the spring pins is reduced.

Figure 5:
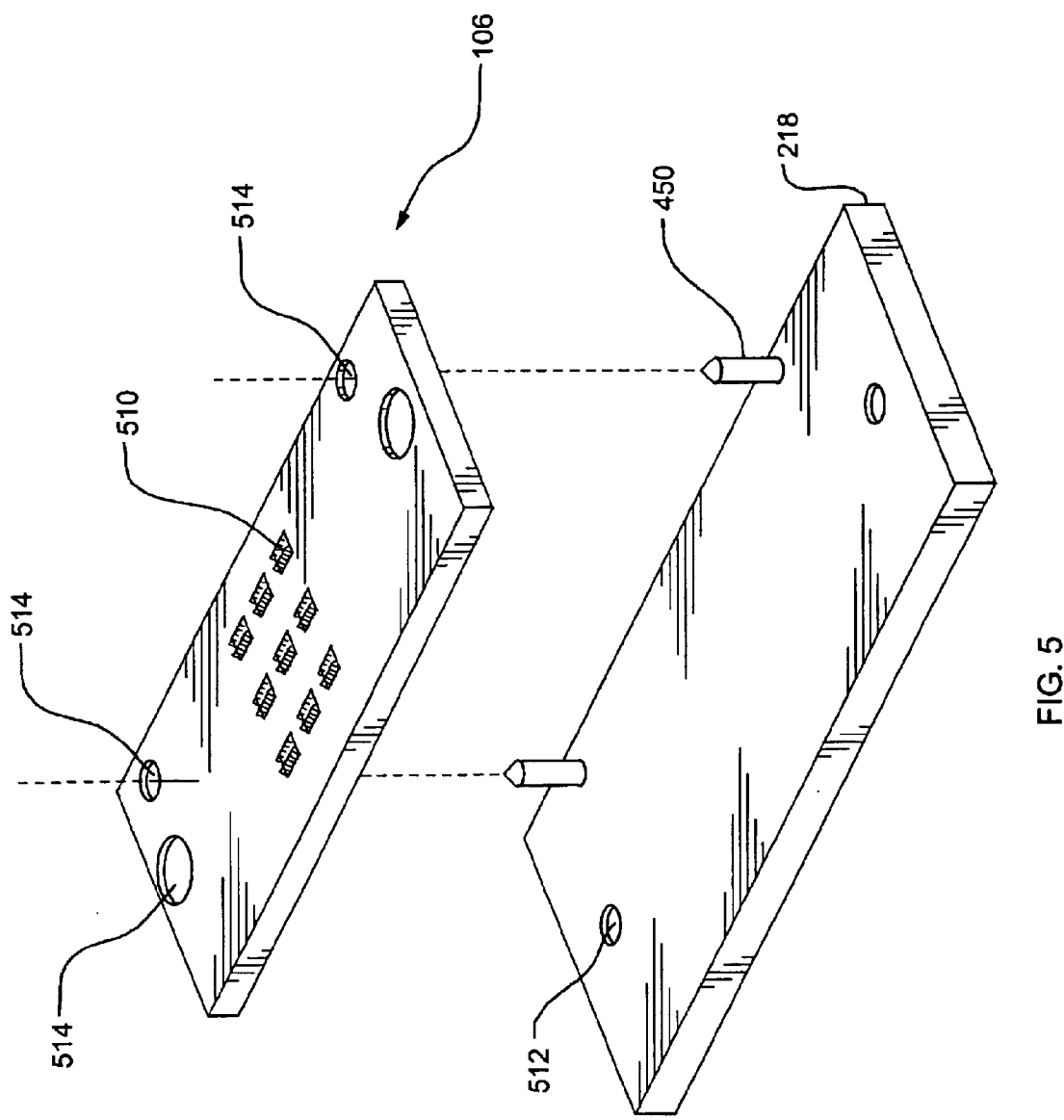
FIG. 5 is a sketch illustrating alignment of a DIB to a DIB carrier.

Turning to FIG. 5, additional details of the mounting of DIB 106 to DIB stage 218 is shown. DIB 106 is shown with a plurality of contactors 510. Alignment holes 514 are preferably positioned with precision relative to contactors 510. Depending on the material from which DIB 106 is made, holes 514 could have hardened inserts that prevent the holes from changing shape in use and prevent DIB 106 from being damaged during docking. By placing DIB 106 on the alignment pins 450, DIB 106 is attached to and positioned relative to DIB stage 218.

DIB stage 218 includes alignment holes 512. As described above, alignment holes 512 interact with alignment pins 412A and 412B to align DIB stage 218 with the handler during docking. DIB 106 includes holes 514 that are concentric with holes 512. However, in the preferred embodiment, holes 514 have a larger diameter so that they do not engage alignment pins 412A and 412B, thereby avoiding the force required to move DIB stage 218 from being transmitted through DIB 106, which could damage the DIB.

In operation, a DIB change operation would be performed as follows: First, tester 310 is separated from handler 100, preferably by moving tester 310 in the direction indicated Z.

Then, the operator releases latch 410 and swings swing arm 210. The operator then latches swing arm 210 to latch 440.

Next, the operator grasps handle 220 and pulls DIB stage 218 clear of tester 310. With the DIB assembly telescoped as shown in FIG. 2, the operator then removes DIB DIB 106 from DIB stage 218 by sliding it off pins 450. The operator can then slide a new DIB 106 onto pins 450.

The operator then pushes DIB stage 218 back into the interface area. Then, the operator releases latch 440 and swings swing arm 210 back and latches it to latch 410.

To complete the operation, tester 310 is redocked to handler 100.

In this way, the DIB can be quickly changed. And, no special tools were required for the operation.

Having described one embodiment, numerous alternative embodiments or variations might be made. For example, in the preferred embodiment, the DIB is attached to the handler. It is not intended to limit the invention to such a configuration. A DIB changer might, alternatively be attached to the tester.

Also, no particular materials are described for the components of the DIB changer. No particular materials are required. The members of the invention may be made of any suitable material that will withstand the forces placed on them during operation. The precise materials may be selected based on standard engineering practices and are dependent on the size of the DIB and other factors related to the designed of the automatic test system. However, it is envisioned that much of the DIB changer subassembly will be machined metals.

Further, hinge 212 is shown to be a simple pivoting hinge. More complicated motions might be incorporated into the hinge. For example, hinge 212 might allow the swing arm to move away from the handler before it pivots.

Also, it was shown that the force needed to make good electrical connection between DIB 106 and contacts on the tester is achieved by pulling the tester against the handler with the mounting hardware. Alternatives, such as pulling DIB to the tester with a vacuum could also be used.

Further, depending on the design of the test system and the DIB, it might not be necessary to add a separate DIB stage 218. Many DIBs are manufactured with DIB stiffeners or other similar devices that could be adapted for use as a DIB stage 218. Conversely, a DIB might include a stiffener or other support structure. The support structure, rather than the printed circuit board itself, might be attached to DIB stage 218.

Also, it should be appreciated that in the presently preferred embodiment a DIB may be changed manually. However, any or all of the steps done manually by a human operator might be done with machines.

Therefore, the invention should be limited only by the spirit and scope of the appended claims.

What is claimed is:

1. A method of manufacturing semiconductor devices with ATE that includes a material handling unit and a tester that mate at a mating area, and an interface unit in the mating area, the ATE further including a subassembly for positioning the interface unit, the method comprising
   a) telescoping the subassembly to expose an attachment point;
   b) attaching the interface unit on the attachment point;
   c) collapsing the telescoped assembly;
   d) moving the subassembly into engagement with alignment features on the ATE, whereby the interface unit is positioned relative to the ATE.

2. The method of claim 1 wherein attaching the subassembly comprises attaching the subassembly without tools.

3. The method of claim 1 wherein the moving the subassembly comprises pivoting the subassembly.

4. A method of manufacturing semiconductor devices with ATE that includes a material handling unit, a tester that mate at a mating area, and an interface unit in the mating area, the ATE further including a subassembly for positioning the interface unit, the method comprising:
   a) moving the subassembly to separate the interface unit from the mating area,
   b) sliding the interface unit along the subassembly until the interface unit is exposed; and
   c) removing the interface unit from the subassembly.

5. The method of claim 4 additionally comprising, prior to moving the subassembly, separating the handling unit and the tester.

6. The method of claim 4 wherein moving the subassembly comprises pivoting the subassembly.

7. The method of claim 4 wherein the interface unit comprises a DIB for a handler.

8. The method of claim 4 wherein removing comprises removing without the use of tools.

9. The method of claim 4 additionally comprising attaching a different interface unit, sliding the interface unit into the mating area and rotating the subassembly until the different interface unit is in the mating area.

10. An automatic test system comprising a subassembly adapted for use in changing an interface unit, the subassembly comprising:
   a) a base member having a first end movably attached to the automatic test system and a second end;
   b) at least one stage slidably coupled to the base member;
   c) an interface unit removably attached to the stage.

11. The automatic test system of claim 1 wherein the first end of the base member is pivotably coupled to the automatic test system.

12. The automatic test system of claim 1 wherein the stage comprises a plurality of alignment pins and the interface unit comprises a plurality of holes and the interface unit is removably attached to the stage by alignment pins passing through the holes.

13. The automatic test system of claim 1 wherein the at least one stage comprises at least two stages, whereby the base member and the at least two stages form a telescoping subassembly.

14. The automatic test system of claim 1 wherein the automatic test system comprises a material handler and a tester and the base member is movably attached to the material handler.

15. The automatic test system of claim 1 additionally comprising an alignment feature on the automatic test system and a complementary alignment feature on the stage, whereby the stage is positioned relative to the automatic test system through engagement of the alignment features on the automatic test system and the stage.

16. The automatic test system of claim 15 wherein the alignment feature on the test system comprises at least one alignment pin and the alignment feature on the stage comprises at least one hole.

17. The automatic test system of claim 1 comprising a handler and a tester and wherein the interface unit comprises a DIB.

18. The automatic test system of claim 17 wherein the base member is movably attached to the handler with a hinge.

19. The automatic test system of claim 18 additionally comprising a latch on the handler, the latch being positioned to hold the base member adjacent the handler.

20. The automatic test system of claim 18 additionally comprising alignment features on the handler and the at least one stage whereby the DIB is aligned to the handler by the engagement of the alignment features on the handler and the stage.

* * * * *